United States Patent
Ho et al.

(10) Patent No.: US 7,511,870 B2
(45) Date of Patent: Mar. 31, 2009

(54) HIGHLY TUNABLE LOW-IMPEDANCE CAPACITIVE MICROMECHANICAL RESONATORS, OSCILLATORS, AND PROCESSES RELATING THERETO

(75) Inventors: Gavin Kar-Fai Ho, Vancouver (CA);
Farrokh Ayazi, Smyrna, GA (US);
Siavash Pourkamali, Atlanta, GA (US);
Krishnakumar Sundaresan, Smyrna, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 162 days.

(21) Appl. No.: 11/251,197

(22) Filed: Oct. 15, 2005

(65) Prior Publication Data

US 2006/0125576 A1    Jun. 15, 2006

Related U.S. Application Data

(60) Provisional application No. 60/619,739, filed on Oct. 18, 2004.

(51) Int. Cl.
*G02B 26/00* (2006.01)
*H03H 9/00* (2006.01)
*H01L 41/00* (2006.01)

(52) U.S. Cl. .................. 359/237; 333/186; 310/314

(58) Field of Classification Search .............. 73/504.03, 73/514.37, 514.38, 514.32, 862.59, 504.12, 73/504.14, 504.15, 105; 310/309, 321, 324, 310/330–332, 366, 314, 317, 320, 353; 333/186, 333/197, 200; 331/108 C, 116 R, 158; 359/631, 359/290, 291

See application file for complete search history.

(56) References Cited

U.S. PATENT DOCUMENTS

| 6,230,563 | B1 * | 5/2001 | Clark et al. ............... 73/504.04 |
| 6,236,281 | B1 * | 5/2001 | Nguyen et al. ............... 331/154 |
| 6,630,871 | B2 * | 10/2003 | Ma et al. .................. 331/116 M |
| 2006/0273416 | A1 * | 12/2006 | Ayazi et al. .................. 257/414 |

OTHER PUBLICATIONS

S. Lee, M.U. DeMirci and C. Nguyen, "A 10-MHz micromechanical resonator Pierce reference oscillator," Tech. Dig. Transducers 01, pp. 1094-1098, 2001.

S. Pourkamali, Z. Hao, and F. Ayazi, "VHF Single Crystal Silicon Capacitive Elliptic Bulk-Mode Disk Resonators," published in JMEMS, V13 N6, 2004.

(Continued)

*Primary Examiner*—Ricky L Mack
*Assistant Examiner*—Tuyen Q Tra
(74) *Attorney, Agent, or Firm*—Kenneth W. Float

(57) ABSTRACT

Disclosed are capacitive micromechanical resonators optimized for high Q, low motional impedance, and large tuning range. Exemplary resonators were fabricated using a HARPSS-on-SOI process, and demonstrated quality factors up to 119000 in vacuum. For resonators operating between 3 MHz and 30 MHz, the lowest extracted impedance is 218 k$\Omega$ and the largest electrostatic tuning coefficient is −240 ppm/V$^2$. The disclosed designs are applicable up to at least 200 MHz operation. An oscillator interface circuit comprising of a trans-impedance amplifier and an automatic bias generator providing a temperature-compensating bias voltage is also disclosed. Experiments show temperature drift reduction from 2800 ppm to 39 ppm over a 100° C. range. Process compensation (DFM) of micromechanical resonators, resonators having mass loading elements that allow generation of closely spaced frequencies, and coupled systems comprising of the resonators are also described.

21 Claims, 11 Drawing Sheets

OTHER PUBLICATIONS

S. Pourkamali, G. K. Ho, F. Ayazi, "Vertical Capacitive SiBARs," published in Proc. IEEE MEMS'05, Jan. 30-Feb. 3, 2005, pp. 211-214.

S. Pourkamali, et al., "Fully single crystal silicon resonators with deep-submicron dry-etched transducer gaps", in Proc. IEEE MEMS '04, The Netherlands, Jan. 2004, pp. 813-816.

* cited by examiner $L_e$ = electrode/flange length
$w_e$ = flange width
$L$ = rod length
$w_m$ = rod width
$h$ = device thickness
$V_p$ = polariation voltage
$Q$ = quality factor
$\varepsilon$ = free space permittivity
$d$ = capacitive gap size f = 5.49 MHz
Q = 119000
$V_P$ = 1V f = 5.49 MHz
Q = 39400
$R_{MEAS}$ = 655Ω
$R_{LOADING}$ = 437Ω
$R_M$ = 218Ω

HIGHLY TUNABLE LOW-IMPEDANCE CAPACITIVE MICROMECHANICAL RESONATORS, OSCILLATORS, AND PROCESSES RELATING THERETO

This application claims the benefit of U.S. Provisional Application No. 60/619,739, filed Oct. 18, 2004.

STATEMENT REGARDING FEDERALLY SPONSORED RESEARCH OR DEVELOPMENT

This invention was made with Government support under Contract No. DAAH01-01-1-R004 awarded by the U.S. Army Aviation and Missile Command. The Government has certain rights in the invention.

BACKGROUND

The present invention relates generally to tunable low-impedance capacitive micromechanical resonators and oscillators and fabrication methods relating thereto.

High performance HF and VHF micromechanical resonators for frequency references and filters require low motional impedance, high quality factor, and frequency tunability. The requirements are derived from the needs for low power consumption, low phase noise, temperature compensation, and resonator array matching. It would be desirable to have micromechanical resonators with quality factors Q similar to quartz crystal units, and the like, and also addresses low impedance and tuning requirements. Typical quartz crystal units have Q of 10,000 or more and frequency variation in the range of 50 ppm over 100° C.

Conventional capacitive micromechanical resonators such as beams, disks, and blocks, each have unique features, but do not meet all the above requirements. HF and VHF capacitive beam resonators have high tunability, but typically have low Q. This is discussed by S. Lee, M. U. DeMirci and C. Nguyen, "A 10-MHz micromechanical resonator Pierce reference oscillator," *Tech. Dig. Transducers* 01, pp. 1094-1098, 2001. Bulk mode disk and rectangular resonators have high Q, but suffer from poor tunability. This is discussed by S. Pourkamali, Z. Hao, and F. Ayazi, "VHF Single Crystal Silicon Capacitive Elliptic Bulk-Mode Disk Resonators," published in *JMEMS*, V13 N6, 2004, and by S. Pourkamali, G. K. Ho, F. Ayazi, "Vertical Capacitive SiBARs," published in *Proc. IEEE MEMS'05*, 30 Jan.-3 Feb. 2005, pp. 211-214. Therefore, a design that satisfies all the above requirements was developed and is disclosed herein.

Reference oscillators have stringent requirements on phase noise and temperature stability, which translate into resonator requirements of high quality factor and frequency tunability. Low motional impedance is also necessary to sustain oscillations and to minimize power consumption. For optimal performance, the interface circuit should include an amplifier circuit that minimizes Q loading, and a means to compensate for the frequency-temperature drift of the resonator. Temperature compensation is most easily achieved using electrical techniques, in which a controlled voltage or current provides frequency tuning. Depending on the employed tuning mechanism, the voltage necessary to properly tune the resonator frequency may not be a linear function. Therefore, it would be desirable to have a mechanism that provides for this.

The most attractive feature for micromechanical resonators is the ease with which multiple resonators can be fabricated. Pluralities of resonators at the same nominal frequency and pluralities of resonators at different target frequencies can be simultaneously fabricated. In applications where closely spaced resonator frequencies (on the order of 1% or less) are required, a robust and reliable technique to design the resonators is desirable.

A plurality of resonators can also be disposed in a coupled-resonator system to provide specific frequency characteristics. High performance bandpass filters, for example, can be constructed using resonators with low impedance, high Q, and good tunability. For this reason, the herein disclosed resonators are also desirable for coupled-resonator systems.

The absolute frequency tolerance of typical quartz crystal units is ±10 to ±50 ppm. Hence, the applicability of micromechanical resonators is contingent on a low-cost manufacturing process that meets similar performance metrics. It would be desirable to have a micromechanical resonator that may be designed for manufacturability (DFM), so that its center frequency is robust to lithography and micromachining variations.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Disclosed herein are resonator designs optimized for high Q, low motional impedance, high electrical tunability, and process variation tolerance. When interfaced with a standard CMOS IC including an amplifier and a temperature-sensitive resonator biasing circuitry, these features enable low power consumption oscillators with improved frequency stability. A technique to obtain closely spaced resonant frequencies is also disclosed. In addition, an exemplary coupled system architecture comprising these resonators are described.

Figure 1:
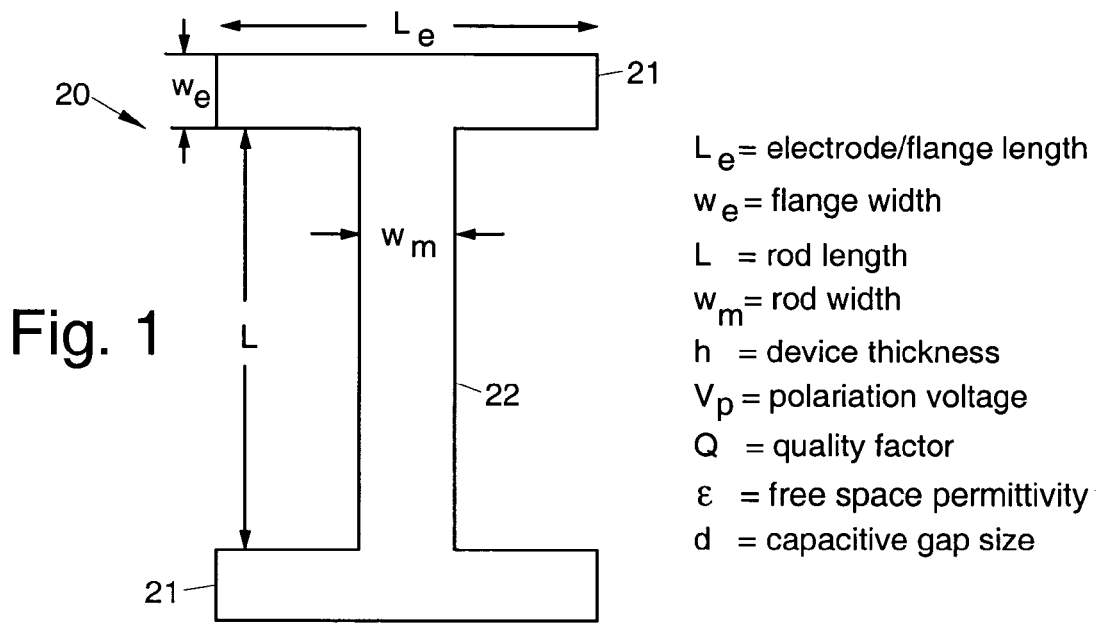
FIG. 1 illustrates an exemplary tunable low-impedance capacitive micro-electro-mechanical resonator (IBAR)

Referring to the drawing figures, FIG. 1 illustrates an exemplary embodiment of a tunable low-impedance capacitive micro-electro-mechanical resonator 20 (which may be referred to as an IBAR 20). FIG. 1 also lists various parameters associated with the IBAR 20, and which are used in the following equations. From the electromechanical model for a symmetrical two-port capacitive resonator 20, the motional resistance given by:

$$R_m = \frac{k_n}{\omega_n Q \left(V_p \frac{dC}{dx}\right)^2} \approx \frac{k_n d^4}{\omega_n Q V_P^2 A_e^2} \quad (1)$$

is inversely proportional to the square of the polarization voltage $V_P$ and electrode overlap area $A_e$, and is also dependent on the capacitive gap size d to the fourth power. The amount of electrostatic frequency tuning is given by:

$$\frac{df}{f} = \frac{\varepsilon A_e}{k_n d^3} V_P^2 \quad (2)$$

and is linearly dependent on $V_P^2$, $A_e$, and $d^{-3}$. The most common approaches to reduce $R_m$ and increase $\delta f/f_0$ involve decreasing d or increasing $V_P$. This is generally discussed by S. Pourkamali, and F. Ayazi, "Fully single crystal silicon resonators with deep-submicron dry-etched transducer gaps", in Proc. IEEE MEMS '04, The Netherlands, January 2004, pp 813-816. Although these techniques are quite effective, they pose stringent fabrication demands and require large voltages.

Figure 2:
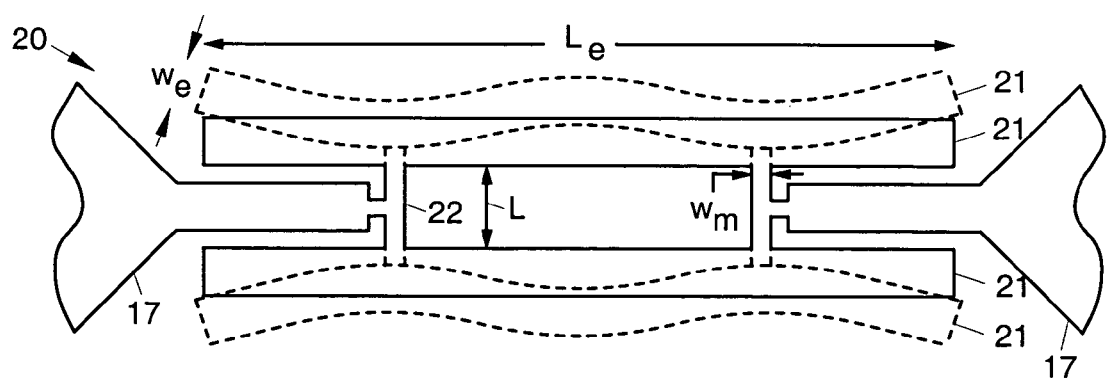
FIG. 2 illustrates another exemplary tunable low-impedance capacitive micro-electro-mechanical resonator ($I^2$BAR)

As disclosed herein, low $R_m$ and high tuning coefficient $\delta f/(f_0 \cdot V_P^2)$ are achieved by increasing the capacitive transduction area $A_e$ while maintaining a small dynamic resonator stiffness $k_n$. As is shown in FIG. 1, in an extensional-mode resonator 20, this can be implemented by extending the length, $L_e$, of electrodes 16 (FIG. 3) and adjacent flexural members 21 (or flexure/shear members 21) of the resonator 20, and using a small rod 22 (or extensional member 22) to provide stiffness. This design resembles the letter "I", which is referred to as an IBAR 20 (which is a bulk acoustic resonator). This basic design concept may be extended further by placing two "I" sections (i.e., two extensional members 22 or rods) adjacent to and separated from each other to form an I²BAR 20 shown in FIG. 2. Two anchors 17 are connected to the extensional members 22 (shown in FIG. 3) through supports 24. The supports 24 are placed in such a way to minimize acoustic loss to the substrate and enable maximum Q. The dashed lines in FIG. 2 illustrate vibration of the flexural members 21 and extension of the extensional members 22.

Figure 3:
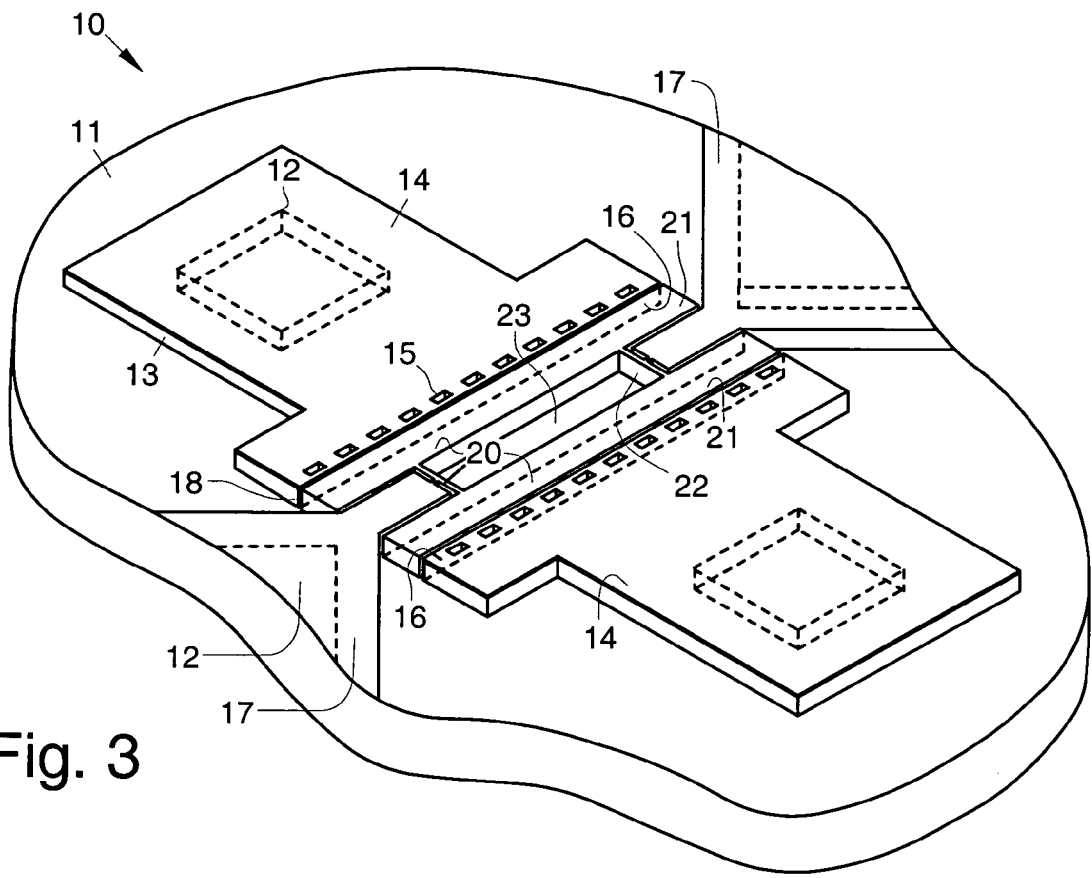
FIG. 3 illustrates a reduced-to-practice embodiment of a 10 μm-thick single crystal silicon HARPSS-on-SOI 4 MHz $I^2$BAR.

FIG. 3 illustrates a reduced-to-practice embodiment of micro-electro-mechanical apparatus 10 comprising a 20 μm-thick single crystal silicon HARPSS-on-SOI I2BAR 20 with 225 nm vertical capacitive gaps 18. The I2BAR 20 and anchor 17 are disposed above a silicon (Si) substrate 11. An oxide insulating layer is formed on the silicon substrate 11. The anchor 17 and resonator 20 are disposed on insulating islands 12 formed from the oxide insulating layer. The resonator 20 and related components are suspended above the silicon substrate 11.

Two silicon pads 13 are formed on top of two of the insulating islands 12, and polysilicon pads 14 are formed thereon. Trenches are formed between the silicon pads 13 and the flexural members 21. The polysilicon pads extend into the trench to form electrodes 16. The electrodes 16 are separated from the flexural members 21 by the vertical capacitive gaps 18 between the pads 13 and the flexural members 21. The polysilicon layer forms doped-polysilicon connection pads 14 and electrodes 16 adjacent to the flexural members 21. Optional release holes 15 may be formed in the connection pads 14 and pads 13. An opening 23 is formed between adjacent edges of the flexural members 21 and the extensional members 22.

The flexural members 21, the extensional members 22, the pads 13, the anchors 17, and the supports 24 are preferably made of low-resistivity single crystal silicon (SCS). LPCVD trench-refilled doped polysilicon electrodes 16 are thus connected to the polysilicon connection pads 14 that are on top of the silicon pads 13. The vertical capacitive gap 18 is defined by a layer of sacrificial LPCVD oxide deposited prior to the trench-refilling process of the polysilicon electrodes 16.

The preferred method of fabricating such resonators 20 begins with a SCS layer on an insulating oxide layer on a substrate 11, otherwise known as a silicon-on-insulator (SOI) substrate. Trenches are etched in the SCS layer to define the flexural members 21, extensional members 22, and the supports 24. A thin sacrificial oxide layer is then grown or deposited and the trenches are refilled with polysilicon to form electrodes 16. The polysilicon is patterned to define the pads 14. Parts of the SCS layer are etched and the resonator 20, anchor 17, support 24, and silicon pad 13 are defined. By etching the sacrificial oxide and insulating layer, the resonator 20 becomes released with a gap 18 to the electrode 16 and suspended above the substrate 11.

Figure 3A:
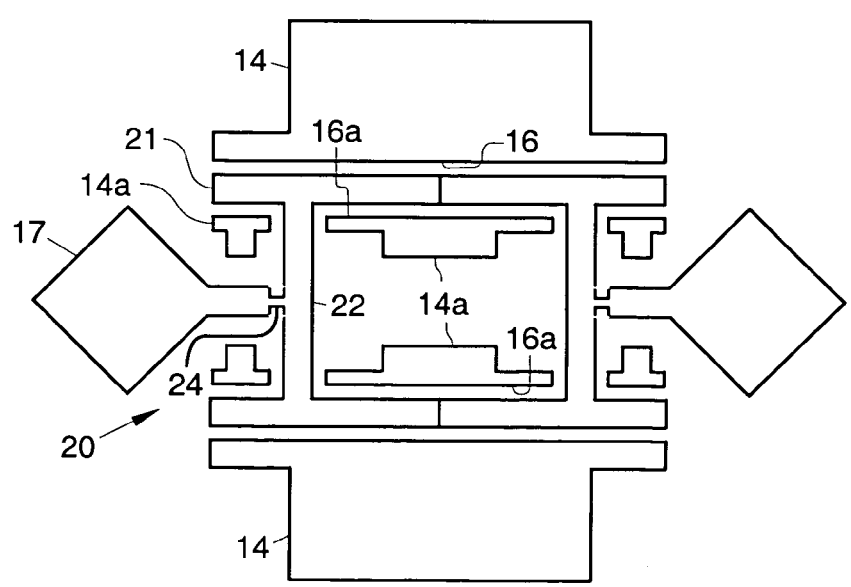
FIG. 3a illustrates an embodiment of an I2BAR having additional electrodes.

FIG. 3a illustrates an embodiment of an I2BAR 20 having additional electrodes 16a disposed adjacent to interior surfaces of the flexural members 21. The electrostatic tunability of capacitive resonators typically decreases as the frequency is increased. In applications where greater tunability is desirable, the additional electrodes 16a provide greater electrostatic tuning in resonators 20.

Figure 4:
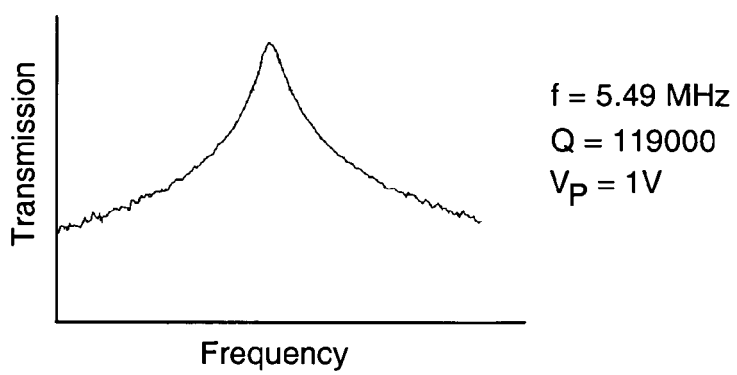
FIG. 4 is a graph that shows frequency response of a reduced-to-practice embodiment of the resonator shown in FIG. 3 having a high measured Q value.
Figure 5:
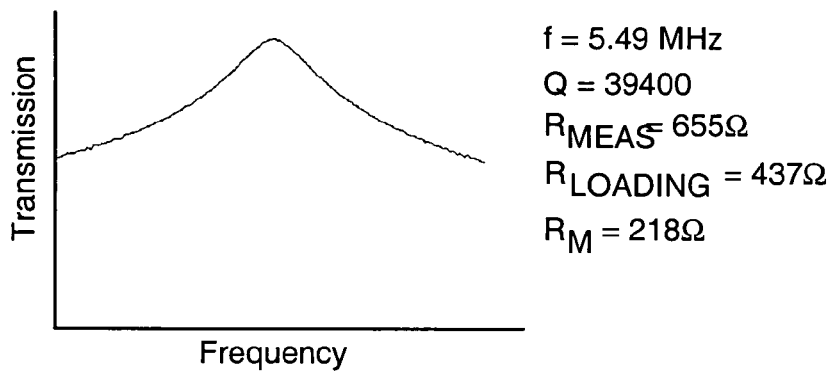
FIG. 5 is a graph that shows frequency response of a reduced-to-practice embodiment of the resonator shown in FIG. 3 having a low impedance.
Figure 6:
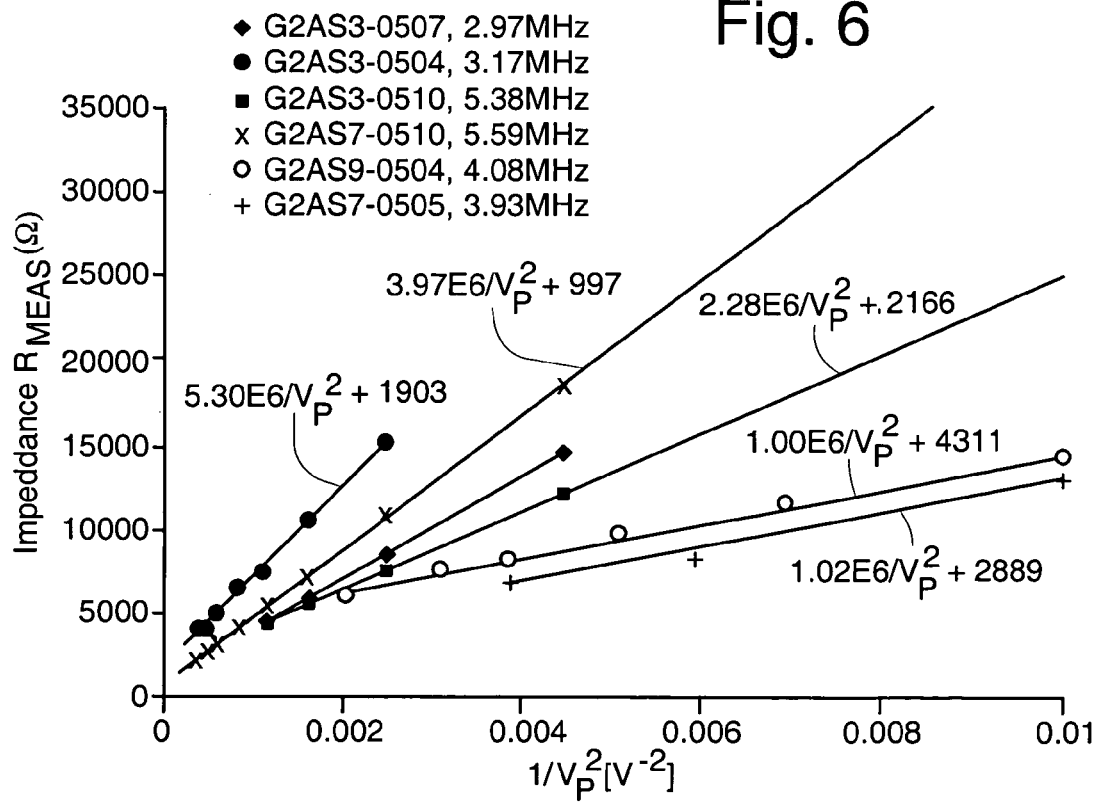
FIG. 6 is a graph showing measured impedance versus inverse square of polarization voltage for several reduced-to-practice embodiments of the IBAR, similar to the resonator shown in FIG. 3.
Figure 7:
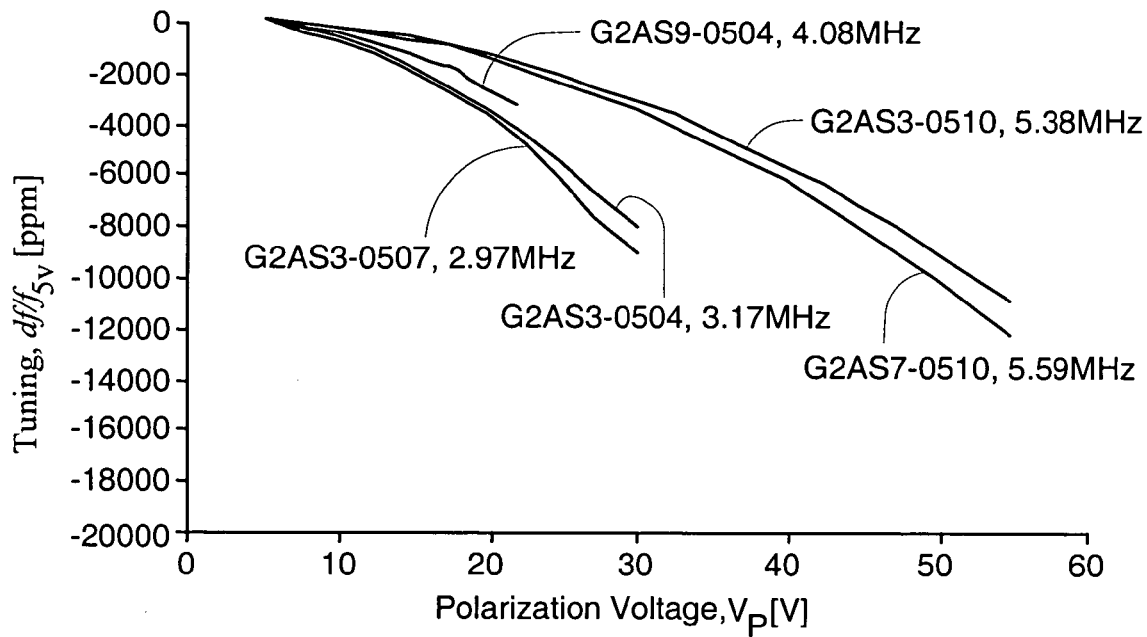
FIG. 7 is a graph showing normalized electrostatic frequency tuning for several reduced-to-practice embodiments of the IBAR.
Figure 7A:
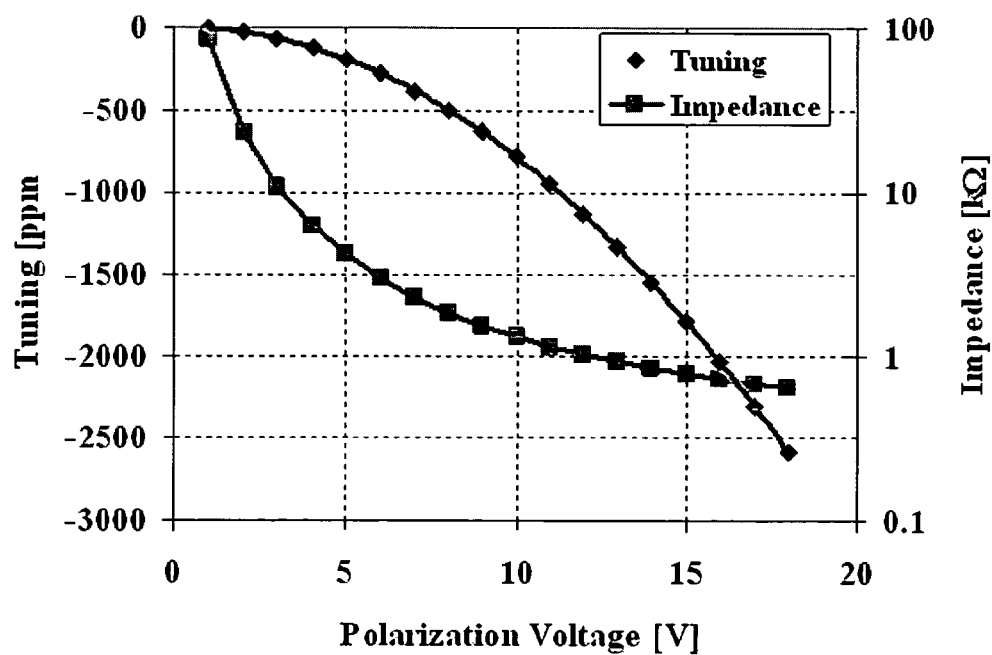
FIGS. 7a-7c are graphs showing normalized frequency shift due to electrostatic tuning for reduced-to-practice $I^2$BARs.

The highest Q measured from an IBAR 20 of 119000, to date, is shown in the measured frequency response in FIG. 4. The lowest extracted impedance from measurement data is 218Ω from the same 5.49 MHz I³BAR 20, shown in FIG. 5. Additional impedance data from several embodiments of I²BARs 20 with large 225 nm gaps 18 is plotted in FIG. 6, and the normalized frequency shift due to electrostatic tuning is plotted in FIG. 7 for these resonators 20. Electrostatic tuning coefficients (ETC) up to −10 ppm/V² were measured in I²BAR resonators 20 having 225 nm gaps, which is illustrated in the plot shown in FIG. 7a. Over 9000 ppm frequency shift was measured for a polarization voltage change from 5V to 30V. These large electrostatic tuning coefficients make electrostatic frequency tuning a suitable option for compensation of frequency drift due to temperature variations.

Figure 7B:
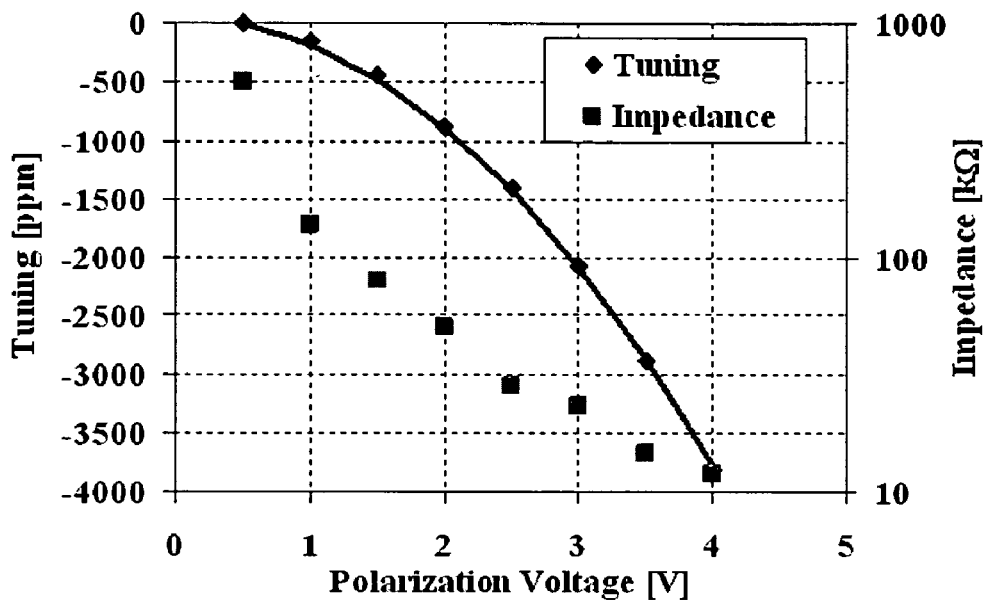
Figure 7C:
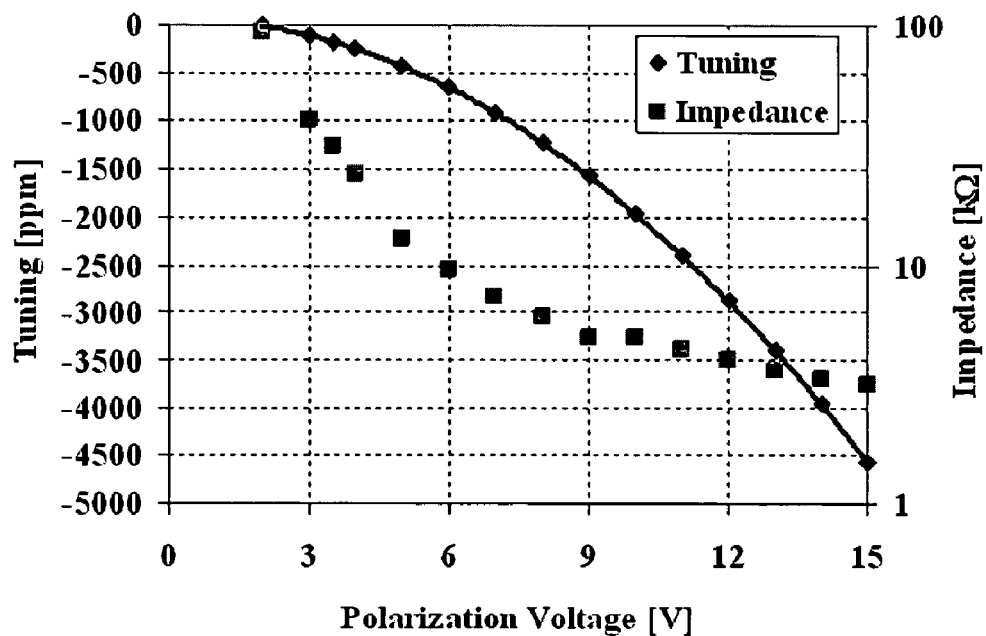

A 10 MHz I²BAR 20 with 65 nm gaps offers 2800 ppm of tuning over a $V_P$ range of only 2-4V as shown in FIG. 7b and obviates the need for high voltages. An ETC of −240 ppm/V² was measured. A 20 MHz I²BAR 20 is also tunable to the extent of 4500 ppm with $V_P$<15V as shown in FIG. 7c, thus enabling thermal compensation with lower voltages at higher frequencies.

Figure 8:
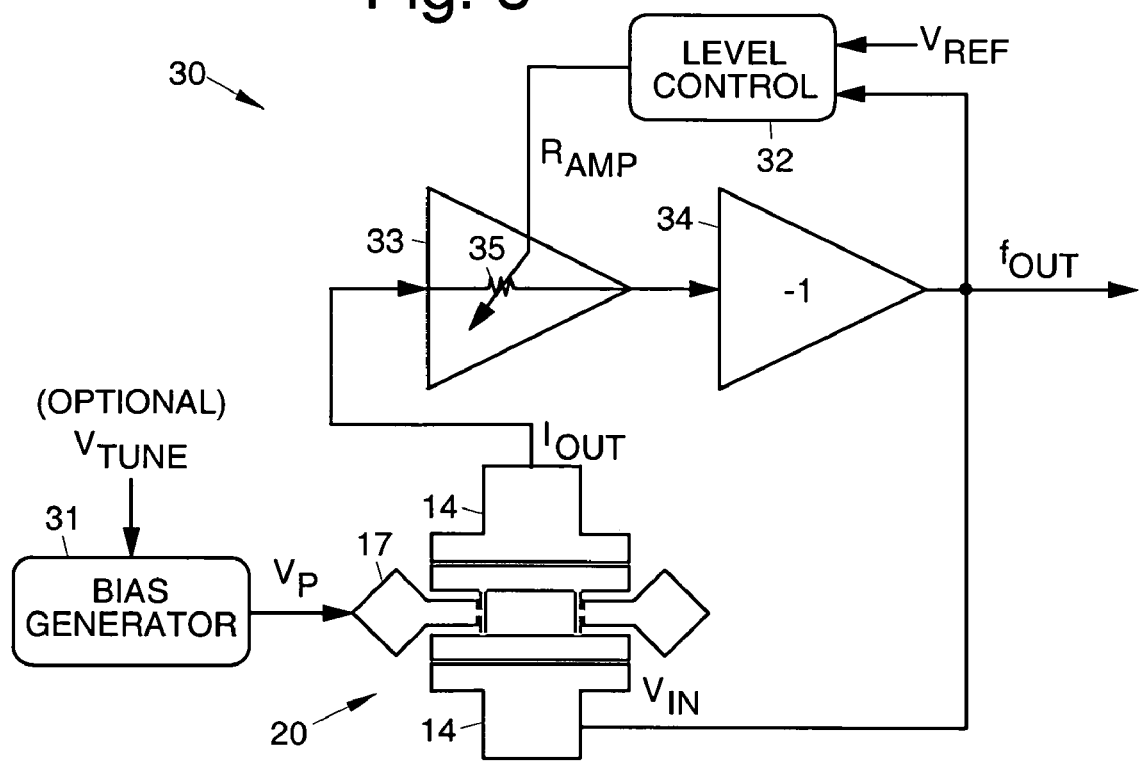
FIG. 8 is a block diagram of an exemplary tunable and temperature-compensated oscillator employing an $I^2$BAR.

Temperature compensated and tunable oscillators 30 may be fabricated using the above-described resonators 20. A block diagram of an exemplary tunable oscillator 30 is shown in FIG. 8. The exemplary tunable oscillator 30 comprises a trans-impedance amplifier 33 and an inverting buffer 34 to satisfy gain and phase-shift criteria, an on-chip bias generator 31, and the resonator 20 in the feedback loop. The bias generator 31 can be used for temperature-compensation and frequency tuning when an optional $V_{tune}$ input is applied. The trans-impedance gain of the amplifier 33 is set by a voltage-controlled MOS resistor 35 to prevent saturation of the resonator 20. A level control circuit 32 processes a $V_{ref}$ signal and the output from the buffer 34 to control the trans-resistance gain $R_{AMP}$ of the amplifier 33. The output signal from the buffer 34 is applied to one of the pads 14 of the resonator 20 and is labeled $V_{in}$. The current output, $I_{out}$, from the resonator 20 is taken from the other pad 14 and input to the trans-impedance amplifier 33.

Figure 9:
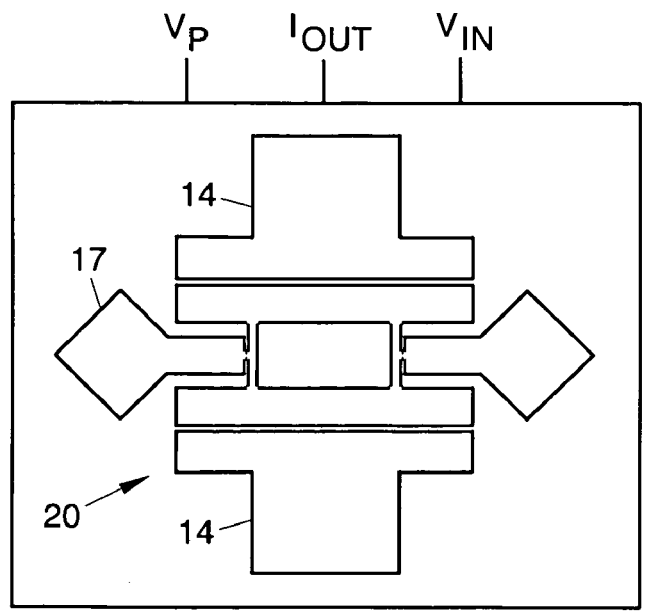
FIG. 9 illustrates connections that may be made to different embodiments of the $I^2$BAR when used in an oscillator.

While FIG. 8 shows exemplary connections that may be made to form an oscillator 30, it is to be understood that other connections may be made, depending upon the requirements and architecture of the oscillator 30. FIG. 9 illustrates that different connections may be made to different embodiments of the I²BAR 20 for use in an oscillator 30. For example, the voltage output ($V_P$) of the bias generator 31 may be applied to a selected one of the anchors 17 or together with $V_{in}$ or $I_{out}$ to one or more of the pads 14. The $V_{in}$ signal may be applied to at least one of the anchors 17 or one of the pads 14. The current output, $I_{out}$, is taken from at least one of the anchors 17 or one of the pads 14.

Figure 10:
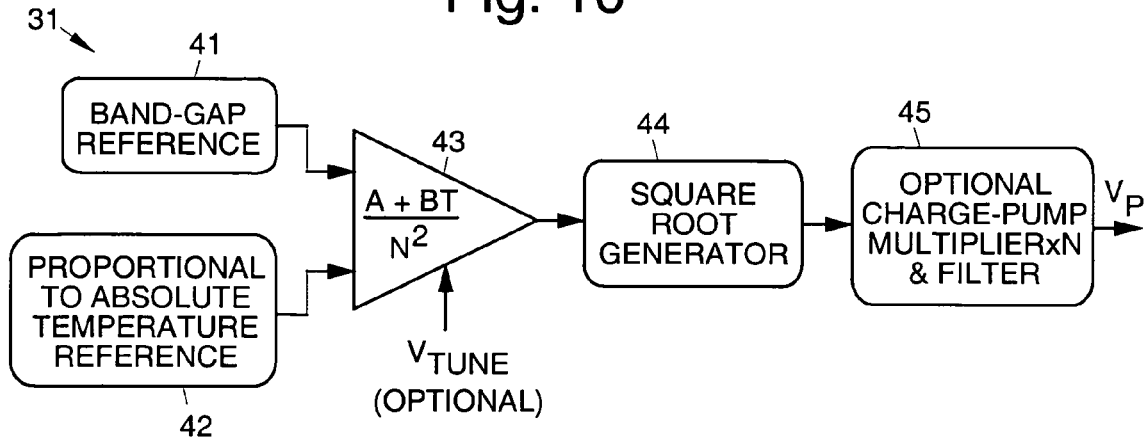
FIG. 10 illustrates an exemplary parabolic temperature compensation circuit for use with the $I^2$BAR oscillator shown in FIG. 8.
Figure 11:
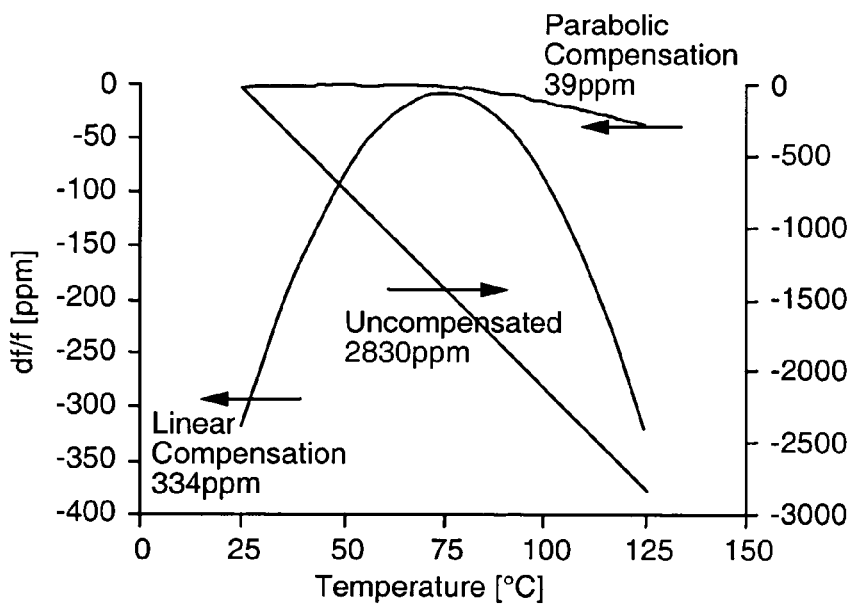
FIG. 11 is a graph showing the temperature drift of an exemplary 6 MHz oscillator over a 100° C. range when it is uncompensated, linearly compensated, and parabolic compensated using the circuit in FIG. 10.

A typical temperature coefficient of frequency (TCF) for a SCS resonator 20 is −25 ppm/K to −30 ppm/K and is shown in FIG. 11. This is compensated by applying predetermined bias voltage values from the bias generator 31 to the resonator 20, such as by using a temperature compensation circuit 31 shown in FIG. 10. Since the change in frequency with bias voltage is parabolic and with temperature is linear, accurate compensation is achieved if:

$$V_P^2 = A + BT \tag{3}$$

where A and B are constants. This can result in temperature variation in the order of 50 ppm, thus making the temperature stability comparable to typical quartz-based oscillators.

Referring to FIG. 10, it illustrates an exemplary parabolic temperature compensation circuit 31 for use with the I²BAR oscillator 30 shown in FIG. 8. The parabolic temperature compensation circuit 31 comprises a band gap reference 41 and a proportional to absolute temperature (PTAT) reference 42 that output reference signals to an amplifier 43. The output of the amplifier 43 is input to a square root generator 44 whose output is coupled to a charge-pump multiplier and filter 45. The charge pump multiplier may be avoided when the resonator 20.is disposed with small gaps and can be tuned with low voltages (FIG. 7b for 10 MHz). An exemplary 6 MHz I²BAR oscillator 30 exhibited a temperature variation of only 39 ppm over 100° C. with parabolic temperature compensation, which is an improvement of 72 times over the uncompensated drift (FIG. 11).

Resonators 20 with closely spaced resonant frequencies are desirable for a number of reasons. Since electrostatic tunability of capacitive resonators typically decreases at higher frequency, closely spaced resonator frequencies enables temperature compensation via electrostatic tuning at higher frequencies.

Figure 12:
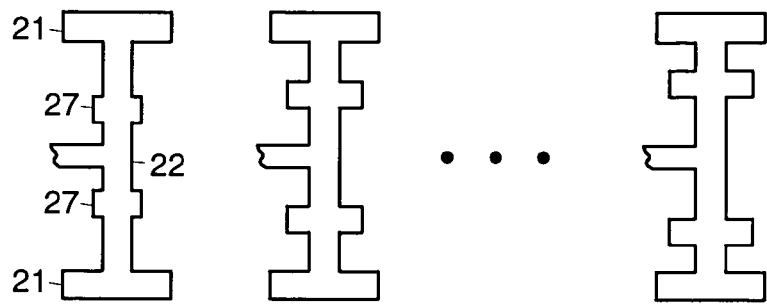
FIG. 12 illustrates an array of IBARs having mass loading elements that allow generation of closely spaced frequencies.
Figure 12A:
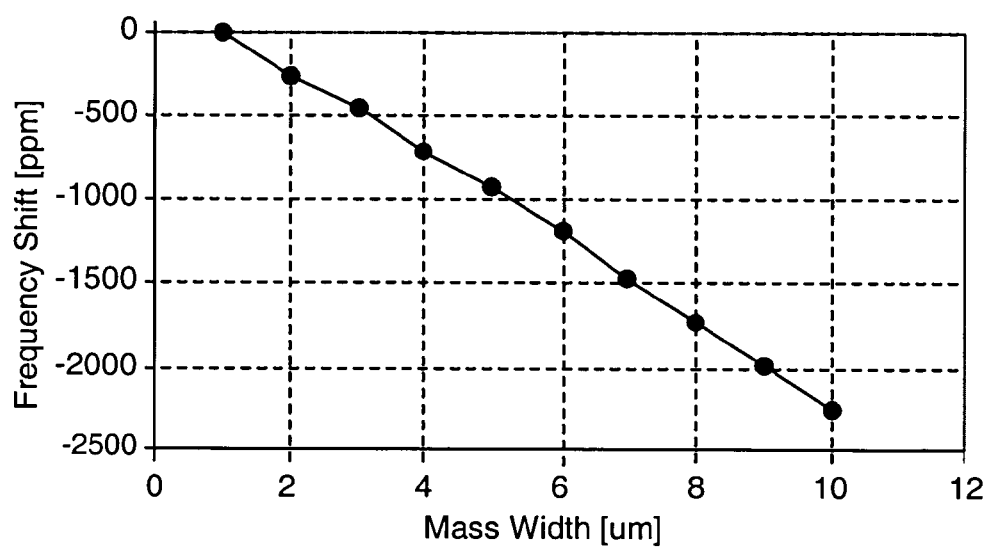
FIG. 12a is a graph showing frequency output for an exemplary array, illustrating linear frequency performance.

FIG. 12 illustrates an array of IBARs 20 having mass loading elements 27 that allow generation of closely spaced frequencies. The mass loading elements 27 may extend from the flexural members 21 or extensional members 22 of each of the IBARs 20. The sizes and positions of the respective mass loading elements 27 are chosen to adjust the resonating frequencies of the respective IBARs 20. Appropriate adjustment of the resonating frequencies creates an array of IBARs 20 having frequencies that span a desired bandwidth. Thus, the frequency output of a particular resonator 20 is chosen when that particular frequency is desired. FIG. 12a is a graph showing frequency output for an exemplary array, illustrating linear frequency performance.

Figure 13:
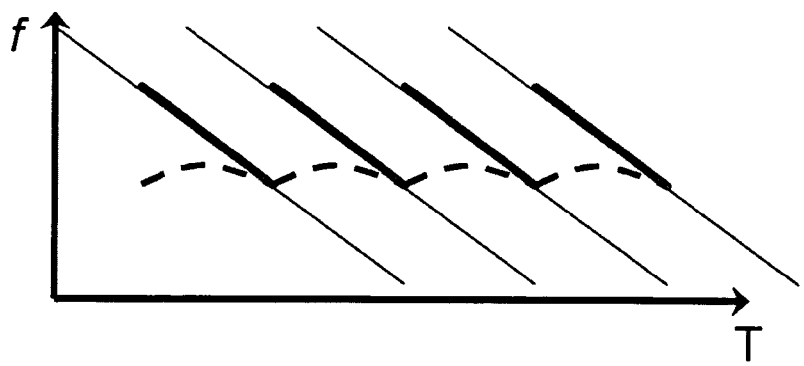
FIG. 13 shows improved temperature stability exhibited from an array of four resonators with mass loading elements.

Improved oscillator temperature stability is enabled for resonators 20 with less tunability when an array with closely spaced frequencies is employed. FIG. 13 shows improved temperature stability exhibited from an array of four resonators 20 with mass loading elements 27.

An array of resonators 20 with nominally identical frequencies or with closely spaced frequencies may be employed in coupled-resonator systems 27, or filters 27, (FIG. 14a-14c) to provide specific frequency responses.

Figure 14A:
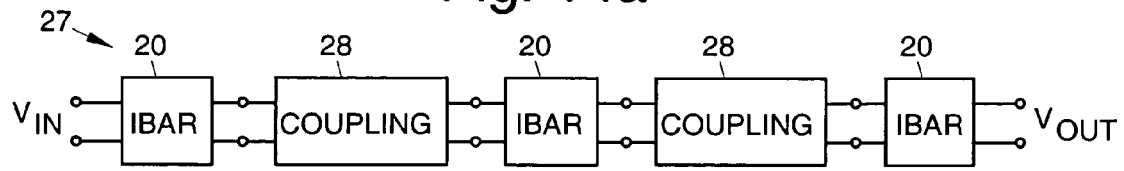
FIG. 14a is a block diagram showing a coupled system of IBARs.
Figure 14B:
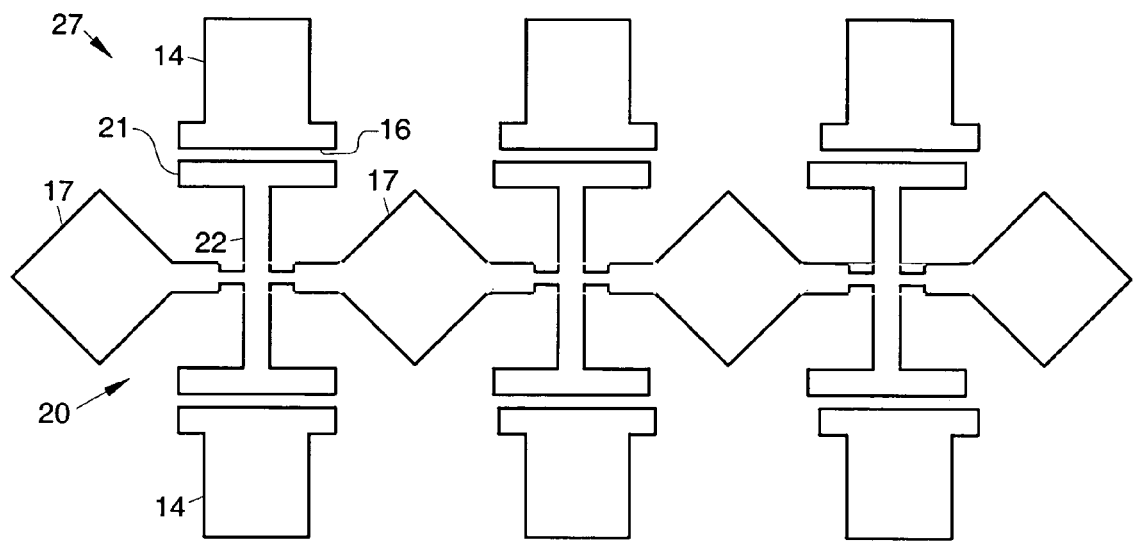
FIG. 14b shows an exemplary coupled system employing multiple IBARs with acoustic wave coupling.
Figure 14C:
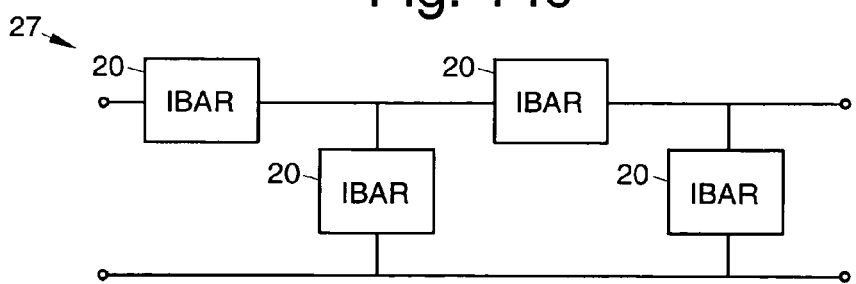
FIG. 14c illustrates another exemplary embodiment of a coupled system of IBARs.

FIG. 14a is a block diagram showing a coupled system of IBARs 20. As is shown in FIG. 14a, a first IBAR 20 receives an input voltage $V_{in}$. The first IBAR 20 is coupled by way of a first coupling 28 to a second IBAR 20. The second IBAR 20 is coupled by way of a second coupling 28 to a third IBAR 20 which outputs an output current $V_{out}$. For example, a plurality of resonators 20 may be configured to form a bandpass filter 27 when properly coupled. A multitude of techniques are available for coupling resonators 20. FIG. 14b shows an exemplary coupled system 27 employing multiple IBARs 20 with acoustic wave coupling. The exemplary embodiment illustrated in FIG. 14b includes three IBARs 20 that are acoustically coupled through their anchors 17. The IBARs 20 may also be electrostatically and capacitively coupled. FIG. 14c illustrates another exemplary embodiment of a coupled system 27 comprising four IBARs 20 that form a filter 27 having a bandpass filter response. The filter 27 shown in FIG. 14c comprises first and second series-connected IBARs 20. A first parallel-connected IBAR 20 is connected to a point between the first and second series-connected IBARs 20. A second parallel-connected IBAR 20 is connected to a point at the output of the second series-connected IBAR 20.

In addition to the resonators 20, oscillators 30, arrays (plurality) of resonators 20, and coupled-systems 27 (filter 27) discussed above, the following is a discussion relating to process compensation and design for manufacturability (DFM) of micromechanical resonators 20. Currently, the primary development bottleneck is achieving absolute accuracy on center frequency. Presented below is a design for manufacturing (DFM) technique for micromechanical resonators 20 to achieve absolute frequency accuracy. The disclosed mechanical compensation technique for IBARs 20 has potential to eliminate individual resonator trimming to enable low cost production.

Figure 15A:
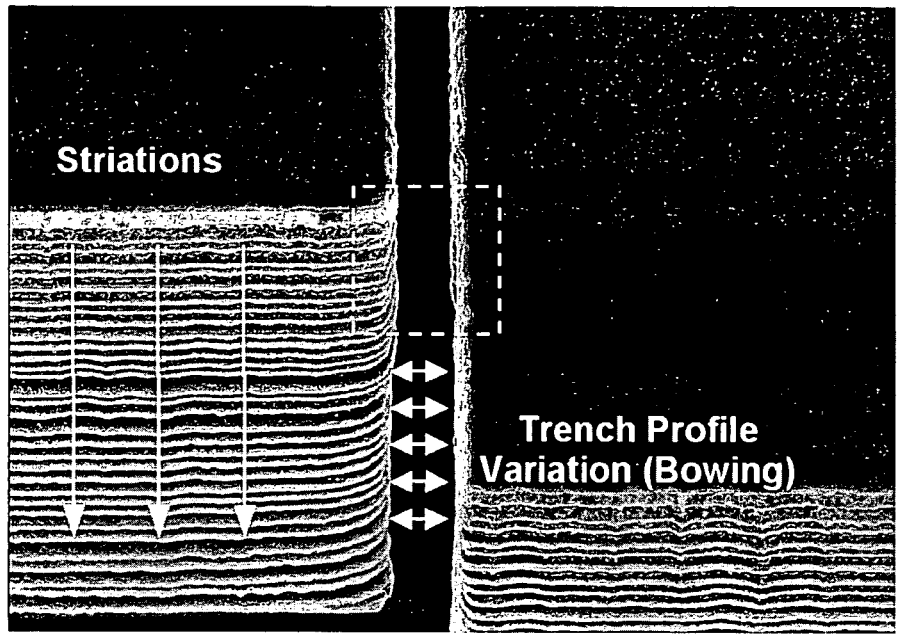
FIGS. 15a and 15b are normal and enlarged scanning electron microscope (SEM) views of the typical roughness and profile of a 10 μmm deep reactive ion etched (DRIE) trench on a silicon-on-insulator (SOI) substrate.
Figure 15B:
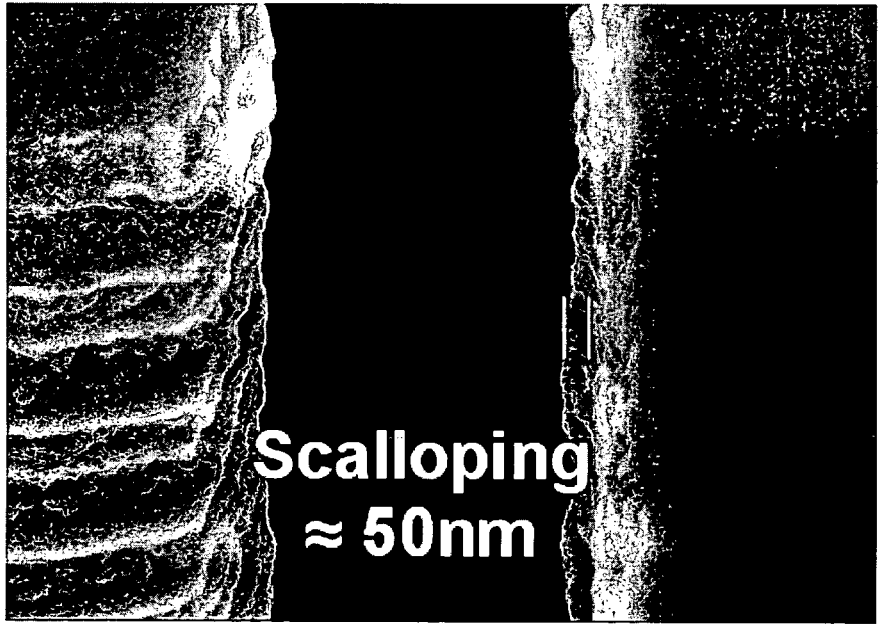

Considering DFM, SCS is ideal over deposited thin films as a structural material because (1) its properties are consistent and well characterized, (2) it has inherent high quality factor Q, (3) resonator performance improves for greater thickness, and (4) manufacturing processes and equipment are available. For example, optimized DRIE recipes can provide high aspect ratio (AR>30) trenches using oxide etch masks. Non-idealities in trench etching, such as scalloping, striations, and bowing, are generally random and can be controlled to within 50 nm (FIGS. 15a, 15b). FIG. 15a shows normal and FIG. 15b shows enlarged (within the dashed box in FIG. 15a) scanning electron microscope (SEM) views showing the roughness and profile of a 10 μm deep reactive ion etched (DRIE) trench on a silicon-on-insulator (SOI) substrate 11.

The majority of variations in micromachining are attributed to lithography and pattern transfer (e.g. to an oxide etch mask for DRIE). Although these variations are temporally random, they are spatially systematic. These variations limit the dimensional accuracy of micromechanical resonators 20, which reflects on their center frequency. For this reason, provisions may be used to compensate for process variations.

Figure 16:
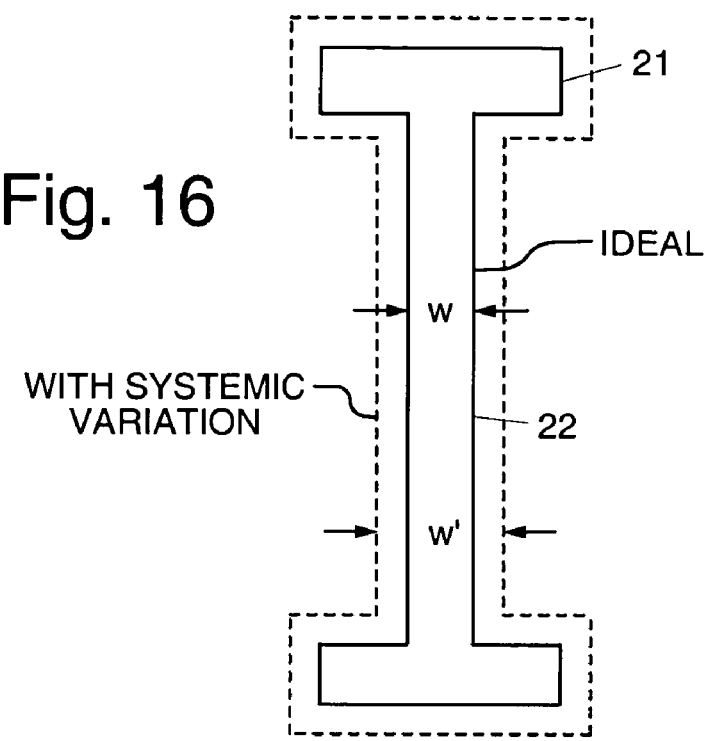
FIG. 16 shows dimensional dependency on trench width of an exemplary IBAR.
Figure 17:
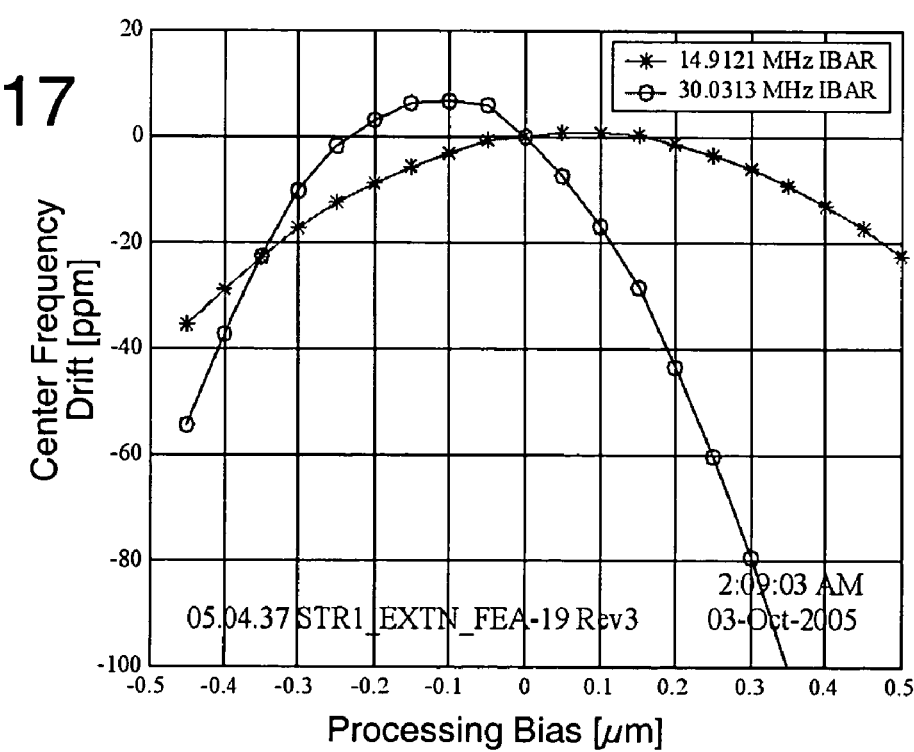
FIG. 17 is a graph showing center frequency variation of exemplary 15 MHz and 30 MHz IBARs demonstrating a design for manufacturability (DFM) technique to reduce frequency variation when dimensions vary.

Process compensation of center frequency $f_c=(k/m)^{1/2}/(2\pi)$ is conceptually straightforward. A tolerant design ensures that the dynamic stiffness to dynamic mass ratio k/m remains constant. The IBAR 20 conveniently has features to completely satisfy this criterion. This is shown in FIG. 16 which shows dimensional dependency on trench width of an exemplary IBAR 20. For an optimized design, the gradient of center frequency on trench width is ideally zero. IBARs 20 at 15 MHz and 30 MHz have simulated frequency deviations of 40 ppm and 130 ppm, respectively, for trench width variations of ±0.5 m. This is shown in FIG. 17 which is a graph showing center frequency variation of 15 MHz and 30 MHz IBARs 20.

Measurement data on a small number of 15 MHz and 30 MHz resonators 20 show absolute and relative frequency accuracy of several hundred ppm (Table 1). Quality factors of 80000+ and 30000+ were measured from 15 MHz and 30 MHz IBARs 20, respectively, at 5 Torr. Although the data disclosed is related to 5 MHz, 15 MHz, and 30 MHz, resonators 20 can readily designed to operate well beyond these frequencies up to at least 200 MHz.

TABLE 1

| Measurement data summary | | |
|---|---|---|
| $f_c$ [MHz] | $df/f_c$ [ppm] | Q |
| 14.913630 | −15 | 81400 |
| 14.914707 | 57 | 87800 |
| 14.913860 | 0 | 84500 |
| 14.916718 | 192 | 80800 |

TABLE 1-continued

| Measurement data summary | | |
|---|---|---|
| $f_c$ [MHz] | $df/f_c$ [ppm] | Q |
| 30.007138 | 0 | 32900 |
| 30.007623 | 16 | 42000 |
| 30.006687 | −15 | 39200 |
| 30.015388 | 275 | 34000 |
| 30.029054 | 730 | 45600 |

While the above discussion addresses IBAR 20, I²BAR 20, and I³BAR it is to be understood that one half of the resonator structures shown in FIGS. 1 and 3, for example, (i.e., the upper or lower half) may be used as a resonator structure, which may be referred to as a TBAR. Oscillators 30 and filters 27 may be readily implemented using such TBARs. In addition, a greater plurality of extensional members 22 can be disposed in resonators 20 with large electrode length Le for greater electromechanical coupling and power handling (linearity).

Thus, tunable low-impedance capacitive micromechanical resonators, oscillators, coupled-resonator systems (filters), and fabrication methods relating thereto, along with resonators arrays, temperature compensation and process compensation for such resonators have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Apparatus, comprising:
a substrate; and
resonator apparatus comprising:
one or more anchors connected to the substrate;
at least one input/output electrode that is electrically insulated from the substrate; and
a resonator comprising an extensional member coupled to the anchor and separated from the substrate, and a flexural member connected to the extensional member that is separated from the substrate and separated from the electrode by a gap.

2. The apparatus recited in claim 1 wherein the resonator comprises a plurality of flexural members connected to the extensional member.

3. The apparatus recited in claim 2 further comprising:
a bias generator for generating a bias voltage coupled to a selected one of the one or more anchors; and
a trans-impedance amplifier coupled to the at least one electrode that selectively feeds back a voltage to at least one input/output electrode, or a selected one of the one or more anchors directly or through a buffer.

4. The apparatus recited in claim 3 wherein the bias generator comprises:
a voltage reference for generating a reference signal;
a proportional to absolute temperature reference for generating a proportional to absolute temperature reference signal;
an amplifier for amplifying the reference and proportional to absolute temperature reference signals; and
a generator for generating the bias voltage.

5. The apparatus recited in claim 2 wherein width and length dimensions of the flexural member and the extensional member are controlled such that the stiffness-to-mass ratio of the resonator is a constant.

6. The apparatus recited in claim 2 wherein multiple resonator apparatus are fabricated on a single substrate and wherein the flexural and extensional members dimensionally vary across the substrate and vary for different substrates, and wherein when resonating, the flexural and extensional members form a dynamic mass and have a dynamic stiffness, and wherein design dimensions of the flexural and extensional members are selected so that the ratio of the dynamic stiffness of the resonator apparatus to the dynamic mass of the resonator apparatus is substantially constant.

7. The apparatus recited in claim 2 which comprises a plurality of resonator apparatus disposed on the substrate, and wherein selected ones of the resonators further comprise one or more mass loading elements selectively disposed on the flexural and extensional members, and when each resonator apparatus is operative over a different predetermined frequency range which is a function of the mass and location of the one or more one or more mass loading elements.

8. The apparatus recited in claim 2 wherein the resonator apparatus further comprises:
at least one additional input/output electrode that is electrically insulated from the substrate, and is disposed on an opposite side of the flexural member from the at least one electrode, and is separated from the flexural member by a gap.

9. The apparatus recited in claim 2 which comprises an array of resonator apparatus disposed on the substrate that have nominally identical frequencies or closely spaced frequencies, and that are coupled together for form filter apparatus.

10. The apparatus recited in claim 1 wherein the resonator comprises a plurality of flexural members connected to a plurality of extensional members, and wherein the plurality of flexural members are separated from a plurality of input/output electrodes by respective gaps.

11. The apparatus recited in claim 10 further comprising:
a bias generator for generating a bias voltage coupled to a selected one of the one or more anchors; and
a trans-impedance amplifier coupled to the at least one electrode that selectively feeds back a voltage to the at least one input/output electrode, or a selected one of the one or more anchors directly or through a buffer.

12. The apparatus recited in claim 11 wherein the bias generator comprises:
a voltage reference for generating a reference signal;
a proportional to absolute temperature reference for generating a proportional to absolute temperature reference signal;
an amplifier for amplifying the reference and proportional to absolute temperature reference signals; and
a generator for generating the bias voltage.

13. The apparatus recited in claim 10 which comprises a plurality of resonator apparatus disposed on the substrate, and wherein selected ones of the resonators further comprise one or more mass loading elements selectively disposed on the flexural and extensional members, and when each resonator apparatus is operative over a different predetermined frequency range which is a function of the mass and location of the one or more one or more mass loading elements.

14. The apparatus recited in claim 1 further comprising:
a bias generator for generating a bias voltage coupled to a selected one of the one or more anchors; and
a trans-impedance amplifier coupled to the at least one electrode that selectively feeds back a voltage to at least one input/output electrode, or a selected one of the one or more anchors directly or through a buffer.

15. The apparatus recited in claim 14, further comprising:
a level control circuit for receiving a reference voltage and the voltage output from the buffer and for generating a gain control signal for setting the gain of the trans-impedance amplifier.

16. The apparatus recited in claim 14 wherein the bias generator comprises:
a voltage reference for generating a reference signal;
a proportional to absolute temperature reference for generating a proportional to absolute temperature reference signal;
an amplifier for amplifying the reference and proportional to absolute temperature reference signals; and
a generator for generating the bias voltage.

17. Apparatus comprising:
a substrate;
a plurality of anchors connected to the substrate;
a plurality of input/output electrodes that is electrically insulated from the substrate; and
a resonator comprising an extensional member coupled to the anchor and separated from the substrate, and a plurality of flexural members connected to distal ends of the extensional member that are separated from the substrate and separated from the electrodes by a gap;
a bias generator for generating a bias voltage coupled to a selected one of the anchors; and
a trans-impedance amplifier coupled to a selected electrode that selectively feeds back a voltage to at least one input/output electrode, or a selected one of the one or more anchors directly or through a buffer.

18. The apparatus recited in claim 17 wherein the bias generator comprises:
a voltage reference for generating a reference signal;
a proportional to absolute temperature reference for generating a proportional to absolute temperature reference signal;
an amplifier for amplifying the reference and proportional to absolute temperature reference signals; and
a generator for generating the bias voltage.

19. The apparatus recited in claim 17 wherein a tuning voltage is input to the bias generator for tuning the frequency of oscillation of the apparatus.

20. Apparatus comprising:
a substrate;
a plurality of resonator apparatus disposed on the substrate that each comprise:
a plurality of anchors connected to the substrate;
a plurality of input/output electrodes that is electrically insulated from the substrate; and
a resonator comprising an extensional member coupled to the anchor and separated from the substrate, and a plurality of flexural members connected to distal ends of the extensional member that are separated from the substrate and separated from the electrodes by a gap;
and wherein selected ones of the resonators further comprise one or more mass loading elements selectively disposed on the flexural and extensional members, and when each resonator apparatus is operative over a different predetermined frequency range which is a function of the mass and location of the one or more one or more mass loading elements.

21. Apparatus comprising:
a substrate;
a plurality of resonator apparatus disposed on the substrate that each comprise:
a plurality of anchors connected to the substrate;
a plurality of input/output electrodes that is electrically insulated from the substrate;
a resonator comprising an extensional member coupled to the anchor and separated from the substrate, and a plurality of flexural members connected to distal ends of the extensional member that are separated from the substrate and separated from the electrodes by a gap; and coupling apparatus for coupling the plurality of resonator apparatus together to provide a coupled resonator response.

* * * * *